United States Patent [19]

Gehweiler

[11] 3,931,588
[45] Jan. 6, 1976

[54] VOLTAGE CONTROLLED OSCILLATOR UTILIZING FIELD EFFECT TRANSISTORS

[75] Inventor: William Frederick Gehweiler, Moorestown, N.J.

[73] Assignee: RCA Corporation, New York, N.Y.

[22] Filed: Sept. 10, 1974

[21] Appl. No.: 504,839

[52] U.S. Cl............ 331/57; 331/108 A; 331/108 B; 331/108 C; 331/135; 331/177 R
[51] Int. Cl.² ...................... H03B 3/04; H03B 5/02
[58] Field of Search.. 331/57, 108 R, 108 A, 108 B, 331/108 C, 108 D, 177 R, 135

[56] References Cited
UNITED STATES PATENTS

| | | | |
|---|---|---|---|
| 3,428,913 | 2/1969 | Pechoucek | 331/57 |
| 3,553,484 | 1/1971 | Gassmann | 331/108 X |
| 3,676,801 | 7/1972 | Musa | 331/116 R |
| 3,831,112 | 8/1974 | Walton | 331/135 X |

Primary Examiner—Siegfried H. Grimm
Attorney, Agent, or Firm—Edward J. Norton; Robert L. Troike

[57] ABSTRACT

An odd number of cascaded inverter stages are connected in a ring configuration. Each stage has a control terminal associated therewith. The signal propagation delay time through a particular stage is controlled by the application of control signals to the control terminal. The frequency of the output signal is determined by the delay per stage and the number of stages in the ring configuration. The output signal can be taken from a point between any two cascaded stages in the ring.

3 Claims, 10 Drawing Figures

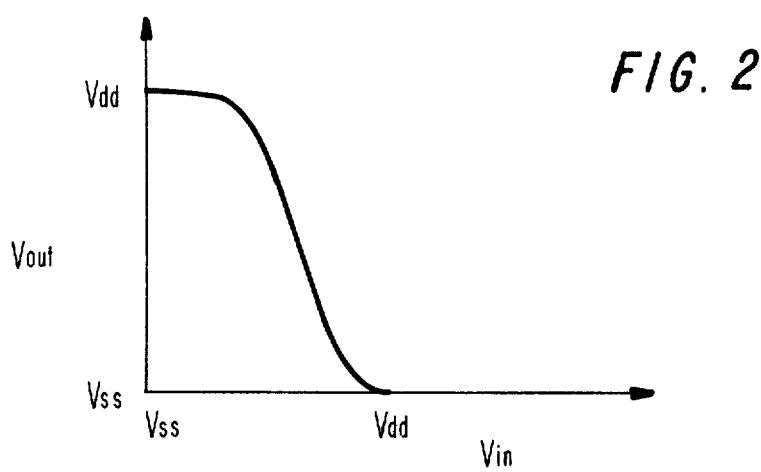
FIG. 2
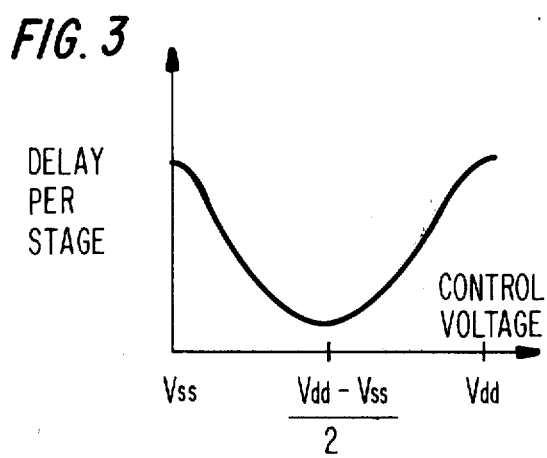
FIG. 3
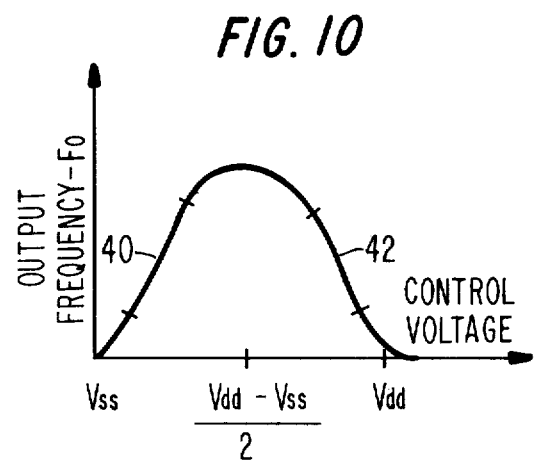
FIG. 10
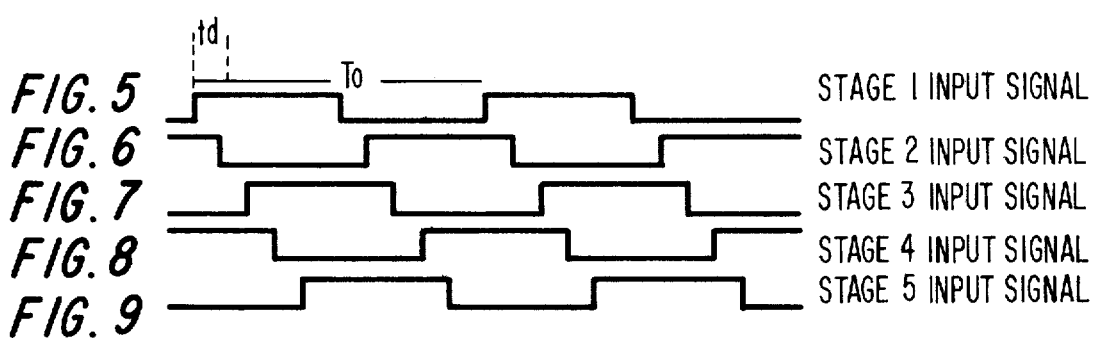
FIG. 5 — STAGE 1 INPUT SIGNAL
FIG. 6 — STAGE 2 INPUT SIGNAL
FIG. 7 — STAGE 3 INPUT SIGNAL
FIG. 8 — STAGE 4 INPUT SIGNAL
FIG. 9 — STAGE 5 INPUT SIGNAL

VOLTAGE CONTROLLED OSCILLATOR UTILIZING FIELD EFFECT TRANSISTORS

The present invention relates generally to voltage controlled oscillators and more specifically to voltage controlled oscillators comprising a plurality of stages connected in a ring configuration.

In the prior art there are several examples of oscillators which are formed by cascading several amplifier stages in a ring configuration. The frequency determining elements of the prior art usually take the form of crystals or RC networks connected in the ring. In some cases one or more of the frequency determining elements may be mechanically or electrically controllable in response to the application of a suitable control signal. The utilization of crystals, RC networks or other similar types of frequency determining elements hinders the fabrication of these prior art voltage controlled oscillators in totally integrated circuit form.

The present invention provides a voltage controlled oscillator configured in a ring of cascaded stages where the frequency of the oscillator is controlled by the application of control signals to the stages in the ring. The signal propagation delay of each of the stages is controlled in response to the control signals applied thereto. The frequency of the oscillator of the present invention is controlled without the use of crystals or RC networks. As will be seen, the present invention is readily adaptable to large scale integration (LSI) techniques.

In accordance with the present invention, a voltage controlled oscillator is provided comprising an odd number of cascaded stages connected in a ring configuration. Means are provided for applying operating biasing voltages to each of the stages. Each stage has a control terminal which is adapted for connection to a source of control signals. The signal propagation delay of a given stage is controlled in response to the control signals applied to the control terminal associated with the given stage. An output terminal is connected at a point between two of the stages in the ring to provide an output signal having a frequency which is controllable.

In the Drawing:

FIG. 2 is a representation of the transfer characteristic of the stage shown in FIG. 1;

FIG. 3 is a representation of the signal propagation delay associated with the stage shown in FIG. 1;

FIGS. 5-9 are waveform diagrams helpful in explaining the operation of the oscillator shown in FIG. 4; and FIG. 10 is a representation of the output frequency versus applied control voltage for the oscillator shown in FIG. 4.

Figure 1:
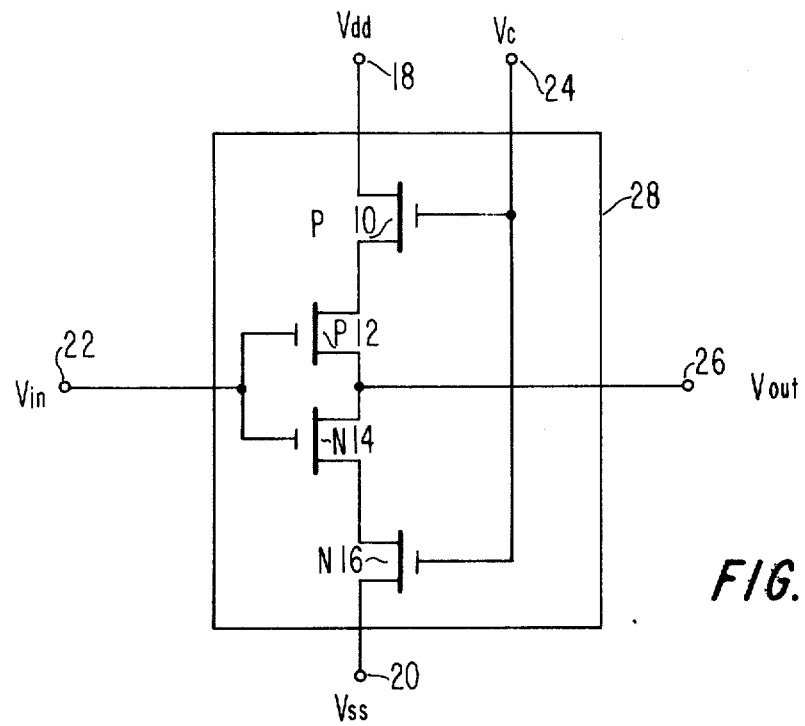
FIG. 1 is a schematic drawing of one stage of a voltage controlled oscillator in accordance with the present invention.

The circuit shown in FIG. 1 is fully disclosed in three United States Patent Applications having serial numbers 365,834, 365,836, and 365,837 assigned to the assignee of the present invention. The circuit shown in FIG. 1 comprises field-effect transistors (FET's) 10, 12, 14 and 16. Transistors 10 and 12 are P conductivity type devices and transistors 14 and 16 are N conductivity type devices. Each of the transistors 10, 12, 14 and 16 have two main electrodes and a control electrode. The main electrodes of transistors 10, 12, 14 and 16 are connected together in the order named to form a series string of devices. A biasing voltage Vdd is applied to terminal 18 which is connected to one main electrode of transistor 10. A biasing voltage Vss is applied to terminal 20 which is connected to one main electrode of transistor 16. The control electrodes of transistors 12 and 14 are joined together and connected to terminal 22 which may be regarded as the stage input terminal. The control electrodes of transistors 10 and 16 are joined together and connected to terminal 24 which may be regarded as the stage control terminal. Finally, a point between the main electrodes of transistors 12 and 14 is connected to terminal 26 which may be regarded as the stage output terminal. Transistors 10, 12, 14 and 16 may, if desired, be constructed on a single integrated circuit substrate 28 using metal-oxide semiconductor (MOS) or silicon-on-sapphire (SOS) fabrication techniques.

The circuit of FIG. 1 has a transfer characteristic represented by the curve shown in FIG. 2. When the input voltage, Vin, applied to terminal 22 is near Vss, the output voltage, Vout, appearing at terminal 26 will be near the voltage Vdd. When the voltage applied to terminal 22 is near Vdd, the output voltage at terminal 26 is near Vss. In a practical example, the voltage Vdd may be plus 5 volts and the voltage Vss may be minus 5 volts. Thus, in the example given, when the input voltage at terminal 22 is at plus 5 volts, the output voltage at terminal 26 will be minus 5 volts. Hence, the circuit of FIG. 1 acts as a signal inverter when operated in the manner just described.

Transistors 10 and 16 may be thought of as two variable impedance devices. The control signals applied to terminal 24 may be thought of as controlling the impedance represented by transistors 10 and 16. That is, for relatively positive voltages applied to terminal 24, transistor 16 tends toward a low impedance level and transistor 10 tends towards a high impedance level. Similarly, for a relatively negative voltage applied to terminal 24 transistor 10 tends toward a low impedance level and transistor 16 tends toward a high impedance level. The control voltage signals, Vc, applied to terminal 24 along with the voltage difference between Vdd and Vss affects the gain-bandwidth product of the stage.

In addition, it has been found that the stage shown in FIG. 1 exhibits a signal propagation delay such as that shown in FIG. 3. In FIG. 3 it is assumed that the voltage difference between Vdd and Vss is held constant. The gain-bandwidth product of the stage is now controlled by the control voltage Vc. The gain-bandwidth product of the stage is related to the signal propagation delay of the stage. It will be seen from FIG. 3 that when the control voltage is midway between Vdd and Vss, the stage exhibits a minimum delay. As the voltage Vc increases or decreases from the midpoint voltage, the delay of the stage increases.

Figure 4:
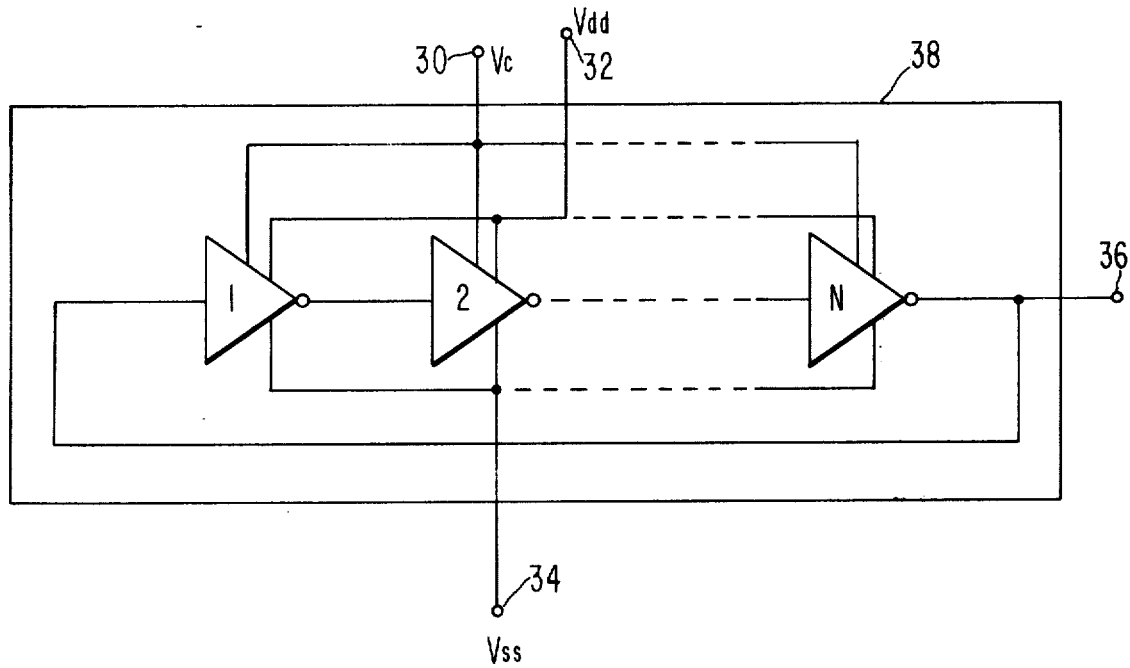
FIG. 4 is a block diagram of a voltage controlled oscillator utilizing an odd number N of the stages shown in FIG. 1.

In FIG. 4 an odd number of identical stages, 1 through N are connected in cascade to form a ring configuration. An odd number of stages, that is stages such as those shown in FIG. 1, are used to form the voltage controlled oscillator shown in FIG. 4 for reasons which will be explained more fully herein.

The individual voltage control terminals for each of the stages are, in the embodiment of FIG. 4, joined together at a common point 30 to which voltage control signals Vc are applied. Similarly, the individual stage biasing terminals are brought together at common points 32 and 34 where the voltages Vdd and Vss are applied respectively. An output terminal 36 is also provided. Terminal 36 is connected to a point between the output terminal of one stage, stage N in this case, and the input terminal of the next stage in the ring, that is, stage 1 in this case. Terminal 36 could have been connected to a point between any two consecutive stages with the same result. Stages 1 through N may be provided on an integrated circuit substrate such as substrate 38.

The operation of the circuit of FIG. 4 is as follows. The voltages Vdd and Vs are applied to the biasing terminals 32 and 34 respectively. In the following example, Vdd is plus five volts and Vss is minus 5 volts. The control voltage Vc is initially set at the value which causes minimum delay per stage, in this case approximately zero volts. When the aforementioned voltages are applied, assume that the input terminal of the first stage goes high, that is to a value near Vdd which may correspond to a logic 1 state. The output terminal of stage 1 goes low in response to the voltage appearing at the input terminal thereof. A logic 0 at the output terminal of stage 1 is also a logic 0 at the input terminal of stage 2. A logic 0 at the input terminal of stage 2 causes a logic 1 to appear at the output terminal of stage 2. Thus the logic inversion continues and after a given time period corresponding to the sum of the delay times associated with the N stages, the input terminal of stage 1 has a logic 0 applied thereof. The process continues, with each stage performing its inverter function. After another time period corresponding to the sum of the delay times associated with the N stages, the input terminal of stage 1 has a logic 1 applied thereto. At this point in time, a full period of a signal wave has been generated in the circuit of FIG. 4. That is, looking at a point between the output terminal of stage N and the input terminal of stage 1, the waveform has progressed from a logic 1, to a logic 0 and back to a logic 1 state. Therefore, the period of the signal is equal to twice the sum of the delay times from all of the cascaded stages.

FIGS. 5–9 help to further illustrate this point. In FIGS. 5–9 it is assumed that there are five stages involved in the configuration of the voltage controlled oscillator. FIGS. 5–9 represent the waveforms which would appear at the input terminals of the five stages respectively. In FIG. 5, td represents the propagation time delay for each stage. That is td is the time it takes for the output signal of a given stage to change in response to a change in the input signal of that stage. In FIG. 5, To represents the period of the waveform at the input terminal of stage 1. It will be seen that once around the ring corresponds to half the period and twice around the ring corresponds to the full period To. Since each of the stages exhibits the same characteristics, the signal at any one of the input terminals will have the same period, i.e., To.

It was assumed in FIGS. 5–9 that the delay per stage was set at a minimum which resulted in a periodic signal having a period of To, or a frequency Fo which equals 1/To. Now, if a positive control signal Vc is applied to each of the stages in FIG. 4 via terminal 30, the delay per stage will increase as will be seen in the curve of FIG. 3. This causes the period of the output signal to increase and thus the frequency of the output signal to decrease. The output frequency versus control voltage, Vc, for the circuit of FIG. 4 is shown in FIG. 10. It will be noted that if the control voltage applied to terminal 30 is decreased, or goes negative, from the initially assumed point of zero volts, the delay per stage increases and the frequency of the output signal again decreases. Thus, when the control voltage Vc starts from the minimum delay point, it is possible to decrease the output frequency with either polarity of control voltage Vc.

The curve of FIG. 10 also demonstrates that there are two areas 40 and 42 wherein the output frequency bears a very nearly linear relation to the applied control voltage. Thus, if in some application it is desired to operate the oscillator in a range where a linear relationship exists between applied control voltage and output frequency, it is possible in operate in such a mode in region 40 or in region 42 on the curve of FIG. 10.

Throughout the discussion it has been assumed that each of the odd numbered stages in the oscillator of FIG. 4 have experienced the same delay factor. In some application it may be desired to impart different time delays to different stages. This may be accomplished by imparting different control voltages to the stages according to the desired result.

In a practical example, 15 stages, similar to that shown in FIG. 1, were fabricated on a single integrated circuit chip in accordance with the circuit shown in FIG. 4. Voltages of plus five volts and minus five volts were used for Vdd and Vss respectively. The minimum delay per stage at a control voltage, Vc, of approximately zero volts, was 1.33ns. This corresponds to a frequency of approximately 25 MHz. With the control voltage set at approximately plus or minus 4 volts, the output frequency was about 2 MHz. The curve corresponding to FIG. 10 for this practical example showed a very linear characteristic, in the two regions such as 40 and 42 over a frequency range of 6MHz to 21 MHz.

Thus, a voltage controlled oscillator has been described which is readily provided in integrated circuit form, is especially useful for LSI applications and does not require external frequency determining components for its operation. This voltage controlled oscillator may be operated in an open loop manner and is particularly useful when operated in a closed loop arrangement such as a phase locked loop where the system error signals may be coupled to the control terminal 30 to control the output frequency.

What is claimed is:
1. A voltage controlled oscillator comprising:
an odd number of cascaded inverter stages connected in a ring configuration:
means for applying operating biasing voltages to each of said stages;
each of said stages comprising two semiconductor devices of one conductivity type and two semiconductor devices of another conductivity type, each of said devices having first and second main electrodes and a control electrode, each stage having a control terminal connected to a common point adapted for connection to a source of control signals, the signal propagation delay of a given stage being controlled by control signals applied to the control terminal associated therewith with each stage of said ring configuration providing substantially the same delay with respect to one another in response to the control signals applied to said common point; and
an output terminal connected to a point between two of said stages for providing an output signal having a controllable frequency.

2. The voltage controlled oscillator according to claim 1 wherein in each of said stages the main electrodes of each of said devices are connected in a series string, the two devices of one conductivity type being the first two devices in said string, the two devices of the other conductivity type being the second two devices in said string, the control electrodes of the first and last device in said string being connected to the control terminal of the stage, the control electrodes of the second and third devices being connected to a point forming the input terminal of the stage, a point between the connection of the main electrodes of the second and third devices forming the output terminal of the stage.

3. The voltage controlled oscillator according to claim 2 wherein said plurality of stages are provided on a common substrate.

* * * * *